United States Patent
Nam

(10) Patent No.: US 9,293,206 B2
(45) Date of Patent: Mar. 22, 2016

(54) MEMORY SYSTEM INCLUDING NONVOLATILE MEMORY DEVICE AND ERASE METHOD THEREOF

(71) Applicant: Sang-Wan Nam, Hwaseong-Si (KR)

(72) Inventor: Sang-Wan Nam, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/534,200

(22) Filed: Nov. 6, 2014

(65) Prior Publication Data

US 2015/0221381 A1 Aug. 6, 2015

(30) Foreign Application Priority Data

Feb. 3, 2014 (KR) .......................... 10-2014-0012175

(51) Int. Cl.
G11C 16/14 (2006.01)
G11C 16/04 (2006.01)
G11C 16/34 (2006.01)

(52) U.S. Cl.
CPC ............ *G11C 16/14* (2013.01); *G11C 16/0483* (2013.01); *G11C 16/3445* (2013.01)

(58) Field of Classification Search
CPC ............... G11C 16/14; G11C 16/0483; G11C 16/3445; G11C 16/16
USPC .............. 365/185.12, 185.18, 185.22, 185.29
See application file for complete search history.

(56) References Cited

U.S. PATENT DOCUMENTS

| | | | | |
|---|---|---|---|---|
| 5,355,464 A | * | 10/1994 | Fandrich | G11C 16/16 365/185.22 |
| 5,805,501 A | * | 9/1998 | Shiau | G11C 16/16 365/185.29 |
| 5,937,424 A | * | 8/1999 | Leak | G11C 16/10 365/385.11 |
| 6,137,729 A | * | 10/2000 | Choi | G11C 16/16 365/185.11 |
| 6,201,739 B1 | * | 3/2001 | Brown | G06F 9/4403 365/185.22 |
| 6,279,070 B1 | | 8/2001 | Jeong et al. | |
| 6,618,291 B2 | * | 9/2003 | Piersimoni | G11C 16/10 365/185.11 |
| 7,110,301 B2 | * | 9/2006 | Lee | G11C 16/16 365/185.11 |
| 7,164,610 B2 | * | 1/2007 | Kimura | G11C 16/10 365/185.29 |
| 7,975,119 B2 | | 7/2011 | Erez | |
| 8,339,850 B2 | * | 12/2012 | Tanizaki | G11C 16/10 365/185.01 |
| 8,364,888 B2 | | 1/2013 | Melik-Martirosian et al. | |
| 8,482,987 B2 | | 7/2013 | Yu et al. | |
| 8,559,236 B2 | | 10/2013 | Nakai et al. | |
| 2005/0180245 A1 | | 8/2005 | Maeda | |
| 2011/0055453 A1 | | 3/2011 | Bennett | |
| 2014/0047167 A1 | | 2/2014 | Kwak | |

FOREIGN PATENT DOCUMENTS

JP     2006146742 A     6/2008

* cited by examiner

*Primary Examiner* — Tan T. Nguyen
(74) *Attorney, Agent, or Firm* — Volentine & Whitt, PLLC

(57) ABSTRACT

An erase method of a three-dimensional nonvolatile memory device may include receiving an erase command, applying an erase voltage to perform an erase operation to a selected memory region in response to the erase command, suspending the erase operation by cutting off the erase voltage after a specific time has elapsed from when the erase voltage is applied, receiving a resume command after a reference time has elapsed from when the erase operation is suspended, and applying the erase voltage to the memory region for the specific time according to the resume command.

20 Claims, 14 Drawing Sheets

MEMORY SYSTEM INCLUDING NONVOLATILE MEMORY DEVICE AND ERASE METHOD THEREOF

CROSS-REFERENCE TO RELATED APPLICATIONS

A claim of priority under 35 U.S.C. §119 is made to Korean Patent Application No. 10-2014-0012175, filed on Feb. 3, 2014, the entire contents of which are hereby incorporated by reference.

BACKGROUND

The present inventive concept relates to semiconductor memory devices, and more particularly, to memory systems including nonvolatile memory and to erase methods of memory systems including nonvolatile memory.

Semiconductor memory devices are generally classified as either volatile semiconductor memory devices or nonvolatile semiconductor memory devices. Volatile semiconductor memory devices, which generally exhibit high read/write speeds, are characterized by the loss stored data when their power supplies are interrupted. In contrast, nonvolatile semiconductor memory device retain their stored data even when their power supplies are interrupted. Thus, nonvolatile memory devices are used when stored contents are to be preserved regardless of whether or not power is supplied.

A popular example of a nonvolatile memory device is a flash memory device, which is widely used as the voice and image data storage media of information devices such as computers, cellular phone, PDA's, digital cameras, camcorder, a voice recorder, a MP3 player, a personal portable terminal, a handheld PC's, game machines, fax scanners, and printers.

A charge trap type of flash memory device, for example, may include a cell string formed in a direction perpendicular to a substrate to form a three-dimensional NAND flash memory. However, the three-dimensional NAND flash memory may exhibit relatively low erase speeds. In this case, a suspend/resume command may be utilized to perform other access operations while an erase operation is performed.

SUMMARY

Embodiments of the inventive concept provide an erase method of a three-dimensional nonvolatile memory device. The erase method may include receiving an erase command, applying an erase voltage to perform an erase operation to a selected memory region in response to the erase command, suspending the erase operation by cutting off the erase voltage after a specific time has elapsed from when the erase voltage is applied, receiving a resume command after a reference time has elapsed from the time the erase operation is suspended, and applying the erase voltage to the memory region for the specific time according to the resume command.

Embodiments of the inventive concept also provide a memory system. The memory system may include a nonvolatile memory device configured to apply an erase voltage for a specific time to a selected memory region in response to an erase command and to remove the erase voltage without an external control after the specific time has elapsed, and a memory controller configured to provide the nonvolatile memory device with at least one resume command for providing the erase voltage for the specific time with reference to a state of the nonvolatile memory device after providing the erase command to the nonvolatile memory device.

Embodiments of the inventive concept also provide a nonvolatile memory device including a plurality of three-dimensional NAND type flash memory cells. The nonvolatile memory device may include a cell array including at least one memory block, a row decoder configured to provide an erase voltage to a selected memory block, a page buffer unit including a plurality of page buffers and configured to perform an erase verification operation in order to sense whether erasure of selected memory block is completed, and a control logic configured to control the row decoder and the page buffer to apply an erase voltage for a specific time to the selected memory block in response to an erase command and suspend applying the erase voltage automatically after the specific time has elapsed.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF EMBODIMENTS

Figure 1:
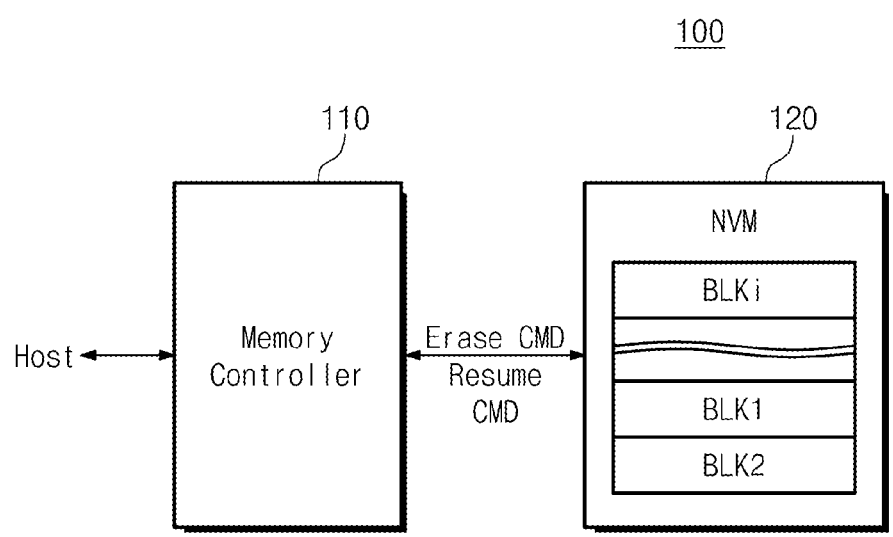
FIG. 1 is a block diagram illustrating a memory system in accordance with an embodiment of the inventive concept.

Embodiments of inventive concepts will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a memory system in accordance with an embodiment of the inventive concept.

Referring to FIG. 1, a memory system 100 may include a memory controller 110 and a nonvolatile memory device 120. If an erase command is sent to the nonvolatile memory device 120, the nonvolatile memory device 120 provides an erase pulse to memory block by a specific unit, and then the nonvolatile memory device 120 stops an erase operation automatically. Thus, the memory controller 110 continuously applies a resume command to complete an erase operation.

The memory controller 110 is configured to control the nonvolatile memory device 120 in response to a request of a host. The memory controller 110 interfaces the host and the nonvolatile memory device 120. The memory controller 110 accesses a selected memory block of the nonvolatile memory device 120 in response to a request of the host.

The memory controller 110 can erase a memory block of the nonvolatile memory device 120 in response to various access requests. The memory controller 110 can erase a selected memory block in response to an erase request that occurs by the host or a memory management operation (merge or garbage collection). In an erase operation, the memory controller 110 provides an erase command and a resume command to the nonvolatile memory device 120. After sending an erase command, the memory controller 110, in the case that other access command does not exist in a queue, periodically sends a resume command to the nonvolatile memory device 120.

The nonvolatile memory device 120 performs erase, read and write operations under the control of the memory controller 110. The nonvolatile memory device 120 includes a plurality of memory blocks BLK1~BLKi and each memory block includes a plurality of memory cells arranged in rows and columns. Each memory block constitutes one erase unit. The nonvolatile memory device 120 performs an erase operation on a selected memory block according to an erase command and a resume command being provided from the memory controller 110.

The nonvolatile memory device 120 provides an erase pulse having a specific pulse width to a pocket P-well of a selected memory block in response to an erase command. If a provision of the erase pulse is finished, the nonvolatile memory device 120 temporarily suspends an erase operation with respect to a selected memory block. This operation is to be called an auto suspend. After the auto suspend (AS), the nonvolatile memory device 120 can operate in response to a command being provided from the memory controller 110 for only limited time. If a new access command to be provided to the nonvolatile memory device 120 does not exist for specific time after an erase command is provided, the memory controller 110 sends a resume command to the nonvolatile memory device 120. Then the nonvolatile memory device 120 applies an erase pulse of the specific pulse width to a selected memory block in response to the resume command.

During the auto suspend (AS) section, the nonvolatile memory device 120 can operate in response to various access commands such as read, write and copy back being provided from the memory controller 110. This operation can be sufficiently completed within the auto suspend (AS) section. That is, a time out with respect to other commands except an erase operation is shorter than the auto suspend (AS) section.

A vertical NAND flash memory being three dimensionally stacked will be described as an illustration of a storage medium of the nonvolatile memory device 120. However, the nonvolatile memory device 120 may be other nonvolatile memory device that needs relatively a lot of time when performing an erase operation. For example, a PRAM, a MRAM, an ReRAM, a FRAM, a NOR flash memory, etc. may be used as a storage medium of the nonvolatile memory device 120.

According to the memory system 100, if an erase request occurs, the memory controller 110 provides an erase command and a resume command with respect to a selected memory block of the nonvolatile memory device 120. In response to the erase command, the nonvolatile memory device 120 applies an erase pulse of a defined pulse width to the selected memory block, suspends an erase operation and waits other access command. In the case that other access command exists, the nonvolatile memory device 120 performs a command being input. In response to the resume command, the nonvolatile memory device 120 generates an erase pulse of a specific pulse width to apply the generated erase pulse to the selected memory block.

After the erase command or the resume command is provided, the nonvolatile memory device 120 applies an erase pulse of a specific pulse width. According to the memory system 100 of the inventive concept, the number of pulses or erase time needed to erase memory blocks may be unified. Thus, erase reliability can be increased.

Figure 2:
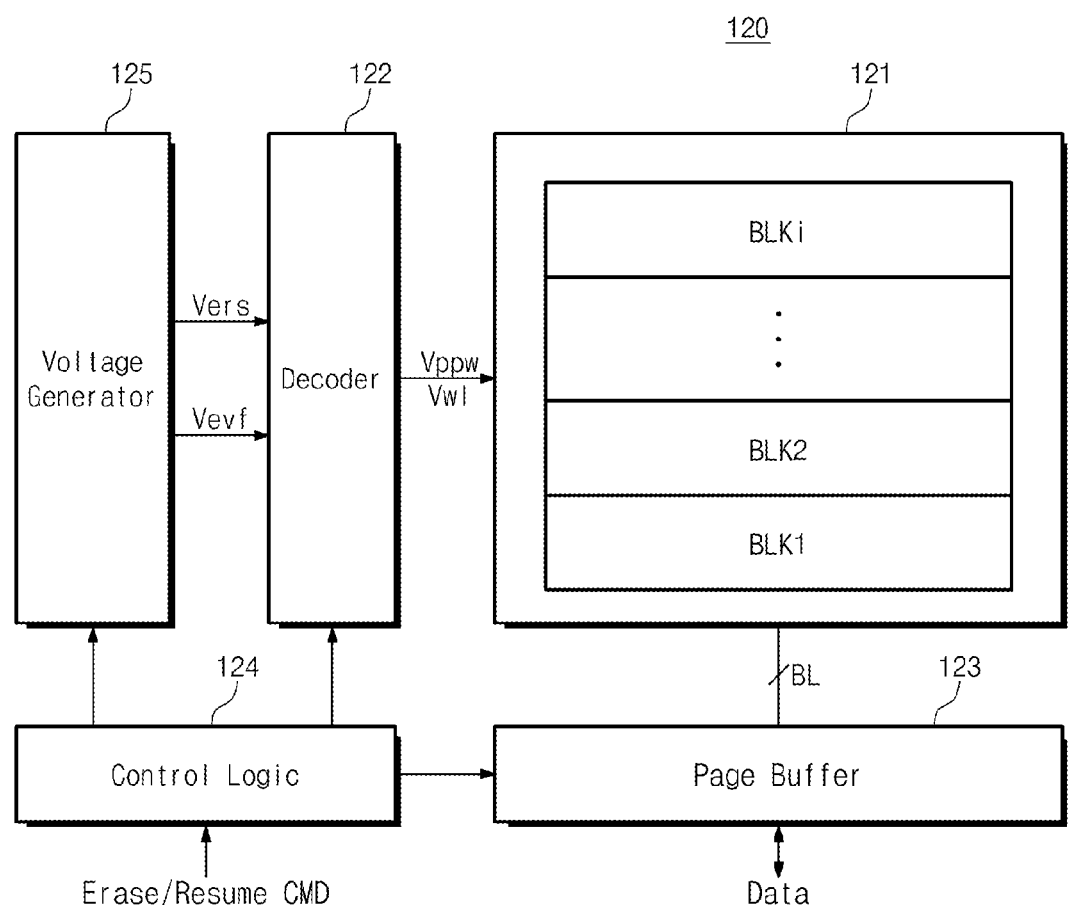
FIG. 2 is a block diagram illustrating a nonvolatile memory device in accordance with an embodiment of the inventive concept.

FIG. 2 is a block diagram illustrating a nonvolatile memory device in accordance with an embodiment of the inventive concept.

Referring to FIG. 2, a nonvolatile memory device 120 includes a cell array 121, a decoder 122, a page buffer 123, control logic 124 and a voltage generator 125.

The cell array 121 is connected to the decoder 122 through word lines WLs or selection lines SSL and GSL. The cell array 121 is connected to the page buffer 123 through bit lines BLs. The cell array 121 includes a plurality of memory blocks BLK1~BLKi. Each memory block includes a plurality of NAND type cell strings. An erase operation is performed by a memory block unit. In an erase operation, an erase voltage Vers generated from the voltage generator 125 is provided to a selected memory block of the cell array 121. After the erase voltage Vers is provided, an erase verify voltage is provided to word lines of the memory block.

In response to an address (a block address), the decoder 122 can select any one of memory blocks of the cell array 121. The decoder 122 provides erase voltages Vppw and Vwl to a word line and a bulk (or substrate) of the selected memory block. The erase voltage Vppw means a voltage being provided to a bulk or a pocket P-well and the erase voltage Vwl means a voltage being provided to a word line. Various levels of erase biases being provided from the voltage generator 125 are commonly called the erase voltage Vers.

The page buffer 123 operates as a write driver or a sense amplifier depending on an operation mode. In a program operation, the page buffer 123 sends a bit line voltage corresponding to data to be programmed to a bit line of the cell array 121. In a read operation, the page buffer 123 senses data stored in a selected memory cell through a bit line. The page buffer 123 latches the sensed data to send the latched data to the outside.

The control logic 124 controls the decoder 122, the page buffer 123 and the voltage generator 125 in response to a command being sent from the outside. The control logic 124 performs a segment erase operation on the selected memory cell in response to an erase command or a resume command being provided from the outside. That is, the control logic 124 automatically suspends an erase operation after an erase voltage is applied to the selected memory block for specific time in response to the erase command or the resume command. The control logic 124 can control the voltage generator 125 or the decoder 122 so that an erase operation is suspended after performing the erase operation on the selected memory block for only specific time in response to the erase command or the resume command. This operation is an auto suspend (AS).

The voltage generator 125 generates various types of word line voltages to be provided to word lines and a voltage to be provided to a bulk (for example, a well region) in which memory cell are formed under the control of the control logic 124. Examples of word line voltages to be provided to word lines are a program voltage Vpgm, a pass voltage Vpass, a read voltage Vrd, a pass read voltage Vread, etc. The voltage generator 125 can generate selection line voltages $V_{SSL}$ and $V_{GSL}$ being provided to selection lines SSL and GSL in read and program operations. The voltage generator 125 can generate erase various levels of voltages Vers. The voltage generator 125 generates an erase voltage Vers of a specific pulse width under the control of the control logic 124. Each erase voltage Vers may have a different level.

The nonvolatile memory device 120 of the inventive concept can perform a segment erase operation of providing an erase voltage for only specific time in response to an erase command or a resume command from the memory controller 110. Unit of voltage stress which memory blocks of the nonvolatile memory device 120 suffer from in an erase operation can be standardized and equalized through the segment erase operation.

Figure 3:
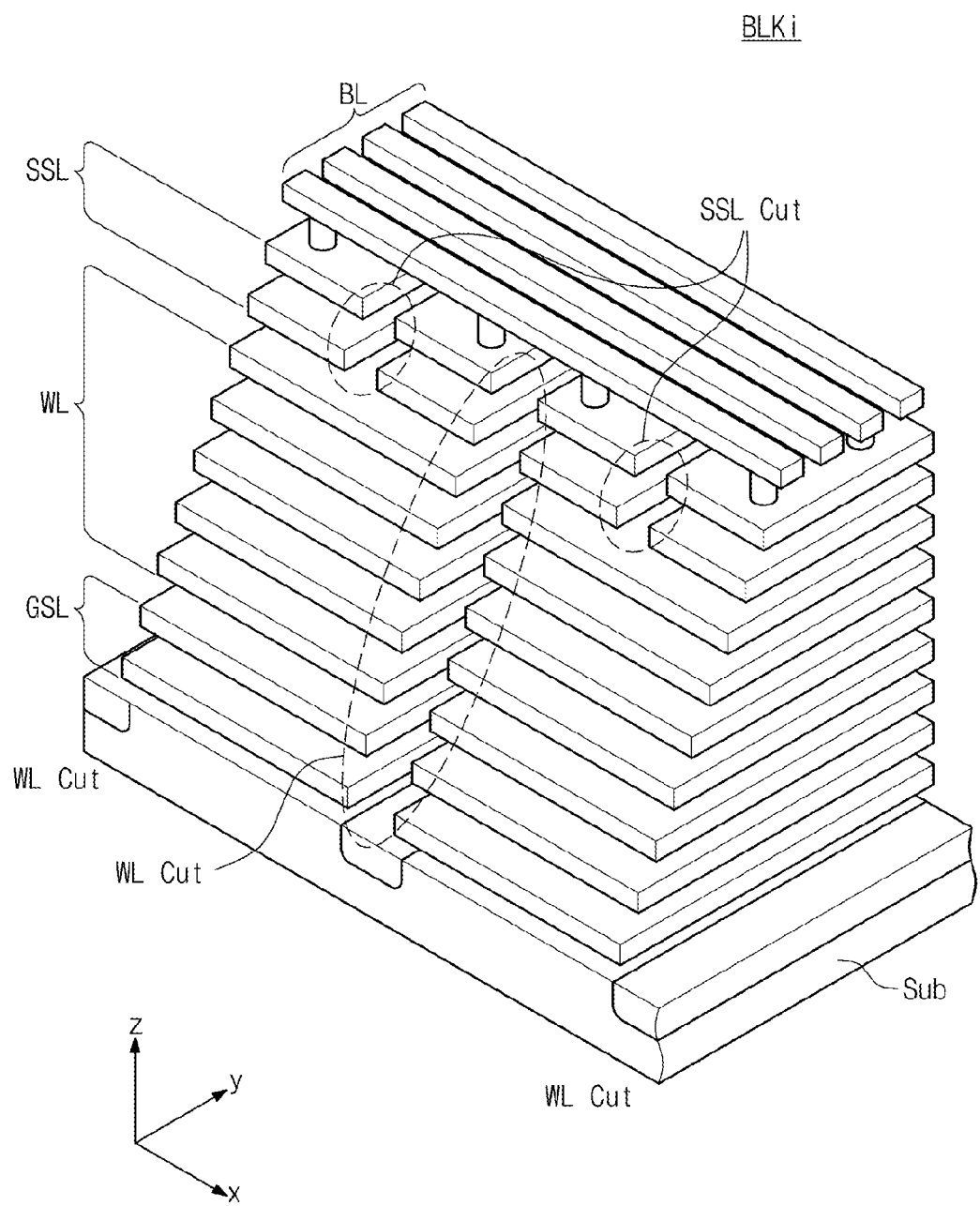
FIG. 3 is a perspective view illustrating an example of a structure of a memory block of FIG. 2.

FIG. 3 is a perspective view illustrating a structure of a memory block of FIG. 2.

Referring to FIG. 3, in a memory block BLKi, ground selection lines GSL, a plurality of word lines WL and string selection lines SSL are stacked on a substrate. The stacked conductive layers can be divided by a word line cut (WL cut). At least one string selection line SSL can be divided by a string select line cut (SSL cut).

A plurality of pillars penetrates at least one ground selection line GSL, a plurality of word lines WL and at least one string selection line SSL along z direction. The at least one ground selection line GSL, the plurality of word lines WL and the at least one string selection line SSL are formed as conductive layers. A plurality of bit lines BL is formed on top surfaces of the pillars. The pillars are connected to respective bit lines.

In the drawing, the string selection line SSL and the ground selection line GSL are formed to have two conductive layers respectively but the inventive concept is not limited to this example. That is, the string selection line SSL and the ground selection line GSL may be formed to have one conductive layer or three conductive layers respectively.

To form a memory block having the structure described above, a charge trap type flash memory is used instead of a floating gate type flash memory. A charge trap type flash memory has a relatively low erase speed compared with a floating gate type flash memory. Thus, in the case of performing a segment erase operation that an auto suspend command and a resume command are provided after an erase command is provided, an erase characteristic of memory blocks can be uniformly managed.

A structure in which a memory block BLKi is three dimensionally stacked was described above. An erase method of the inventive concept may be easily applied to a structure in which a memory block is two dimensionally formed. That is, an application of the erase method of the inventive concept is not limited by a structure of a memory block.

Figure 4:
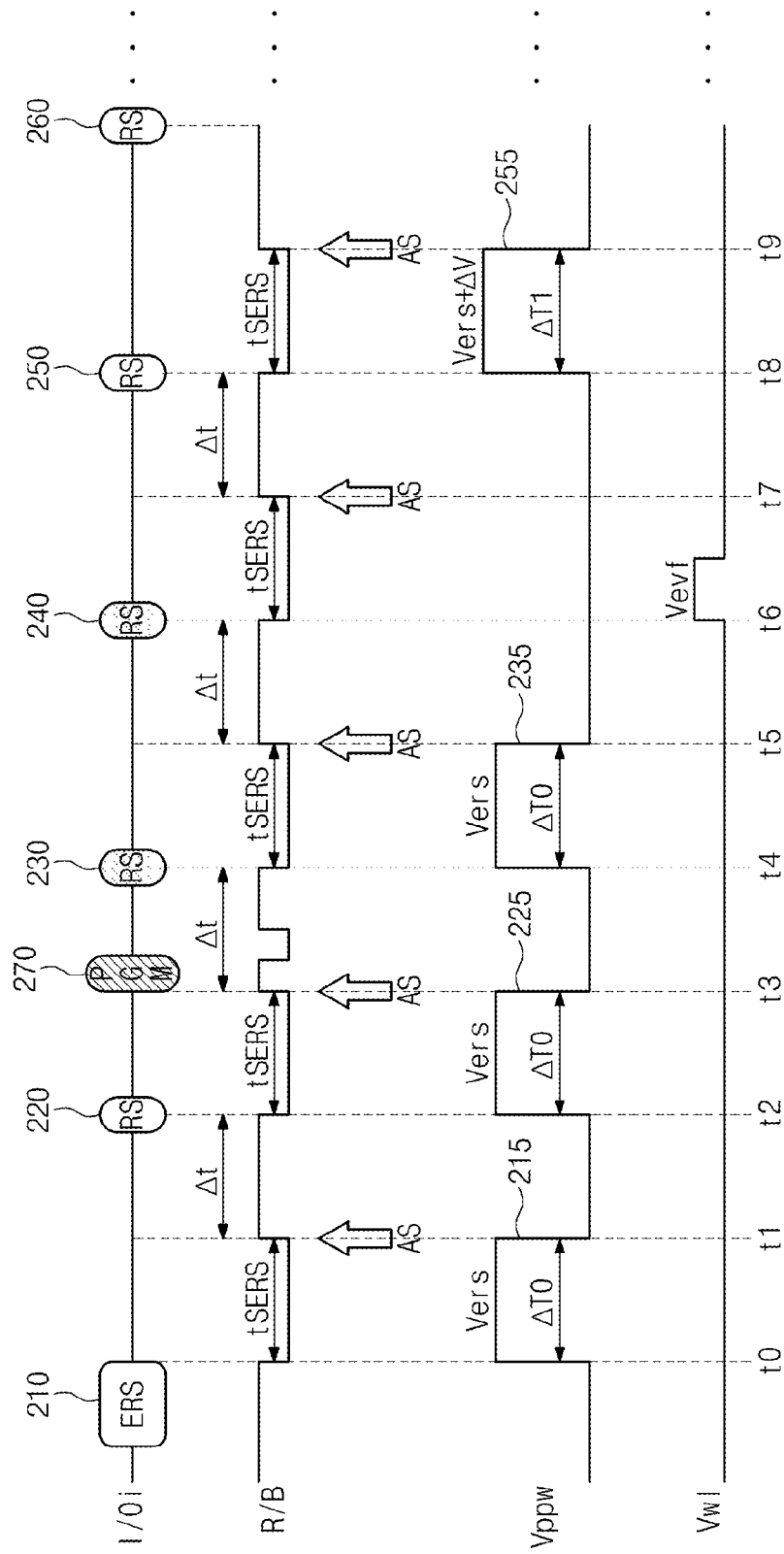
FIG. 4 is a timing diagram illustrating a first embodiment of an erase method of the inventive concept.

FIG. 4 is a timing diagram illustrating a first embodiment of an erase method of the inventive concept.

Referring to FIG. 4, the nonvolatile memory device 120 automatically suspends an erase operation after specific time in response to an erase command ERS 210 or resume commands RS, 220, 230, 240, 250 and 260.

The memory controller 110, if an erase request occurs, sends the erase command ERS 210 to an input/output stage I/Oi of the nonvolatile memory device 120. The erase command ERS 210 includes address information of a memory block being erased. Then the nonvolatile memory device 120 outputs a ready/busy signal (R/B) at a low level at time t0 to inform the outside of a busy state. Time tSERS during which the ready/busy signal (R/B) maintains a low level means that the nonvolatile memory device 120 performs a part of the segment erase operation. The nonvolatile memory device 120 outputs the ready/busy signal (R/B) in a busy state and at the same time applies an erase voltage Vers to a pocket P-well of a selected memory block for specific time ΔT0. That is, the nonvolatile memory device 120 applies an erase pulse 215 having a pulse width of specific time ΔT0 to the pocket P-well of the selected memory block. The time tSERS may be the same as or different from the specific time ΔT0.

At time t1, the nonvolatile memory device 120 executes an auto suspend (AS) of temporarily suspending an erase operation. An erase voltage Vers being provided to the pocket P-well is restored to a level of 0V by the auto suspend (AS). The nonvolatile memory device 120 transits the ready/busy signal (R/B) to a high level to inform the outside of a ready state. During a reference time Δ t from start time of the auto suspend (AS), the memory controller 110 may provide an access command or the resume command RS 220 to the nonvolatile memory device 120. If a standby command does not exist in a command queue, the memory controller 110 sends the resume command RS 220 to the nonvolatile memory device 120 after the reference time Δ t from start time of the auto suspend (AS).

At time t2, the nonvolatile memory device 120 applies an erase pulse 225 corresponding to a pulse width of the specific time ΔT0 to the pocket P-well of the selected memory block in response to the resume command 220. At t3 when the specific time ΔT0 has elapsed, the nonvolatile memory device 120 performs an auto suspend of an erase operation.

In the case that a standby access command exists in a command queue at time of auto suspend of an erase operation, the memory controller 110 applies a corresponding access command to the nonvolatile memory device 120. That is, at time t3, the memory controller 110 can send a program command 270 to the nonvolatile memory device 120. It is assumed that the program command 270 includes write data and an address. Then the ready/busy signal transits to a busy state during program time tPROG and if a program is completed, the ready/busy signal transits to a ready state. An access command such as a write or a read can be sufficiently completed during a section between time when an auto suspend starts and time when a resume command is applied. That is, the reference time Δ t may be determined considering time out of all the commands.

At time t4, if the resume command 230 is provided, the nonvolatile memory device 120 applies an erase pulse 235 to the pocket P-well of the selected memory block. The nonvolatile memory device 120 executes an auto suspend of an erase operation at time t5.

Using the method described above, after providing the erase command ERS 210, the memory controller 110, if a standby command does not exist in a command queue, sends the resume commands 220, 230, . . . , 260 at time intervals considering the reference time Δt and the specific time ΔT0. Then the nonvolatile memory device 120 executes an auto suspend at time when the specific time ΔT0 or the segment erase time tSERS has elapsed from time when the erase command ERS 210 or the resume commands 220, 230, ..., 260 are input. In this way, the erase pulses 215, 225, 235, and 255 are applied to a selected memory block.

If unit erase pulses are provided more than the specific number of times, the nonvolatile memory device 120 performs an erase verify. For example, if the resume command 240 is provided after three erase pulses 215, 225 and 235 are applied, the nonvolatile memory device 120 provides an erase verify voltage Vevf to a word line. If it is verified that threshold voltages of memory cells being erased are lower than the erase verify voltage Vevf, an erase process is over. However, if memory cells having threshold voltages higher than the erase verify voltage Vevf exist among memory cells being erased, an erase process continues by the erase pulse 255 of an increased level (Vers+ΔV) in synchronization with the subsequent resume command 250. That is, at time t8, the erase pulse 255 of a pulse width ΔT1 is provided to a pocket P-well in response to the resume command 250 being provided. The pulse width ΔT1 of the erase pulse 255 may be the same as or different from the pulse width ΔT0 of the erase pulses 215, 225, and 235.

In this way, the memory system 100 can perform a segment erase operation on a selected memory block. The memory controller 110 sends the erase command ERS 210 to the nonvolatile memory device 120. Then the nonvolatile memory device 120 applies an erase pulse of a defined pulse width (for example, ΔT0 or ΔT1) to a selected memory block. The nonvolatile volatile memory device 120 performs an auto suspend operation at time (t1) when a pulse width is finished. The memory controller 110 can perform various access commands in an auto suspend section. If an auto suspend section is finished, the memory controller 110 provides a resume command RS to the nonvolatile memory device 120. The nonvolatile memory device 120 applies an erase pulse of a defined pulse width (for example, ΔT0 or ΔT1) to a selected memory block. A level and applying time of an erase voltage being applied to each memory block being erased by the resume command RS of the memory controller 110 and an auto suspend execution of the nonvolatile memory device 120 may be unified.

Figure 5:
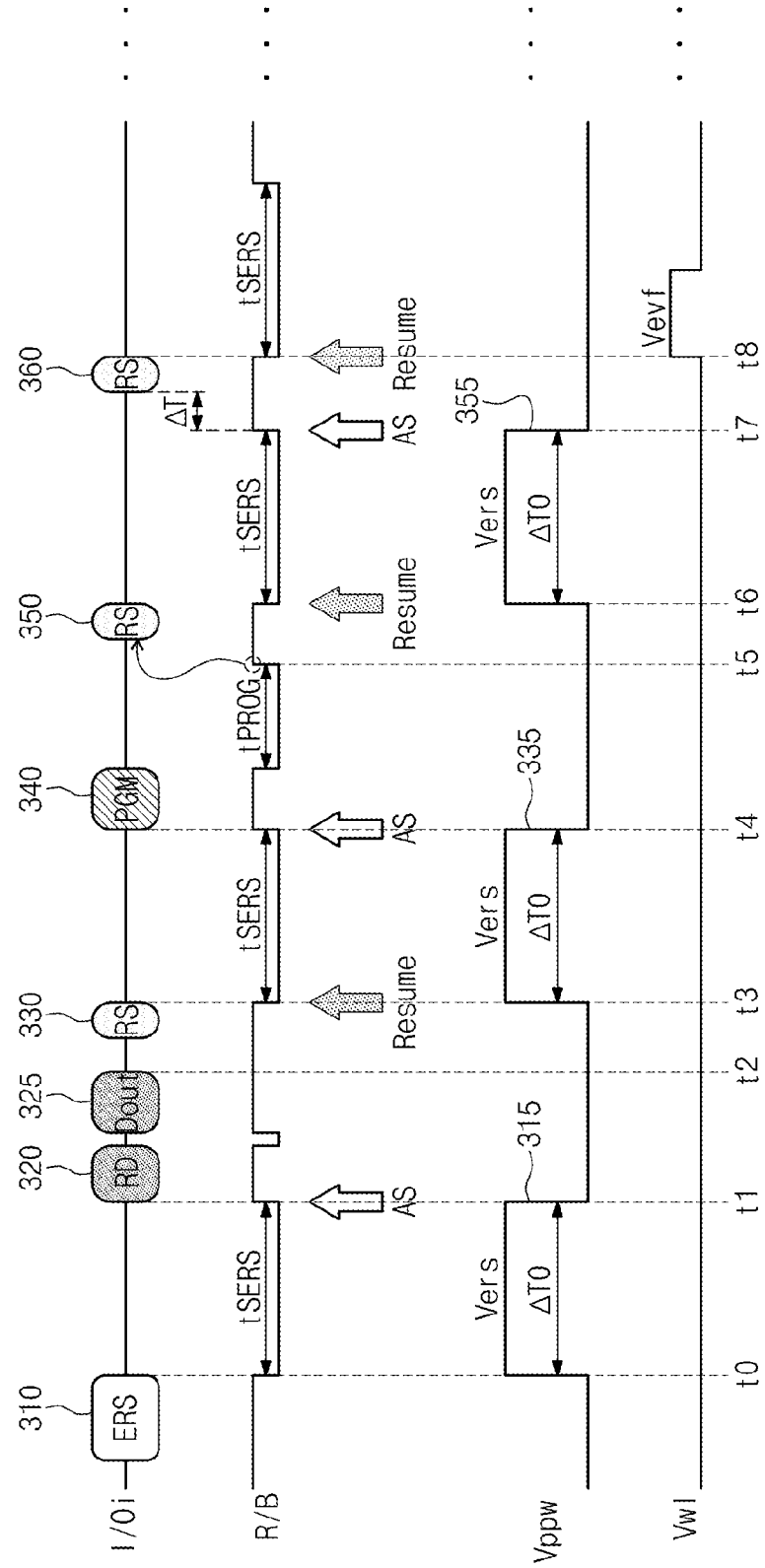
FIG. 5 is a timing diagram illustrating a second embodiment of an erase method of the inventive concept.

FIG. 5 is a timing diagram illustrating a second embodiment of an erase method of the inventive concept.

Referring to FIG. 5, the memory controller 110 can output the resume command RS with reference to the ready/busy (R/B) of the nonvolatile memory device 120.

The memory controller 110, if an erase request occurs, sends an erase command ERS 310 to the input/output stage I/Oi of the nonvolatile memory device 120. The erase command 310 includes address information of a memory block being erased. The nonvolatile memory device 120 transits the ready/busy signal (R/B) to a busy state at time t0. The nonvolatile memory device 120 outputs the ready/busy signal (R/B) in a busy state and at the same time applies an erase voltage Vers to a pocket P-well of a selected memory block for specific time ΔT0. That is, the nonvolatile memory device 120 applies an erase pulse 315 having a pulse width of the specific time ΔT0 to the pocket P-well of the selected memory block. Erase time tSERS may include all preparing time for providing the erase pulse 315 and thereby it may be longer than the specific time ΔT0.

At time t1, the nonvolatile memory device 120 executes an auto suspend (AS). An erase voltage Vers being provided to the pocket P-well by the auto suspend (AS) is restored to a level of 0V. The nonvolatile memory device 120 changes the ready/busy signal (R/B) to a ready state. At this time, assume that a read command RD is on standby in a command queue. Then the memory controller 110 sends the read command RD 320 to the nonvolatile memory device 120 in response to a transition of the ready/busy signal (R/B). The read command 320 includes address information. The nonvolatile memory device 120 outputs readout data 325 to the input/output stage I/Oi in response to the read command 320. During a readout operation, the memory controller 110 toggles a read enable signal (R/E not shown) to receive the readout data 325 being output. If an output of the readout data 325 is completed, the memory controller 110 sends a resume command 330 to the nonvolatile memory device 120.

At time t3, the nonvolatile memory device 120 an erase pulse 335 corresponding to a pulse width of the specific time ΔT0 to the pocket P-well of the selected memory block in response to the resume command 330. At time t4 when the specific time ΔT0 has elapsed from the time t3, the nonvolatile memory device 120 performs the auto suspend of the erase operation.

At this time, assume that a program command is on standby in a command queue of the memory controller 110. Then the memory controller 110 sends the program command PGM 340 to the nonvolatile memory device 120. It is assumed that the program command 340 includes write data and an address. The nonvolatile memory device 120 outputs the ready/busy signal (R/B) in a busy state and writes the inputted write data in the selected memory region during program time tPROG. If the program time tPROG has elapsed, the nonvolatile memory device 120 outputs the ready/busy signal (R/B) in a ready state. The memory controller 110 sends a resume command RS 350 to the nonvolatile memory device 120 at time t5.

At time t6, the nonvolatile memory device 120 an erase pulse 355 corresponding to a pulse width of the specific time ΔT0 to the pocket P-well of the selected memory block in response to the resume command 350. At time t7 when the specific time ΔT0 has elapsed from the time t6, the nonvolatile memory device 120 performs the auto suspend of the erase operation. However, if a standby command does not exist in a command queue when auto suspend (AS) is performed, the memory controller 110 may be set to input a resume command 360 after a reference time ΔT has elapsed from when the auto suspend (AS) is performed.

If the defined number of pulses is applied, an erase verify operation Vevf may be performed. That is, the erase verify voltage Vevf may be applied to a word line of the nonvolatile memory device 120 at time t8. In the case that memory cells which are not erased exist, the nonvolatile memory device 120 applies an erase pulse (not shown) of an increased level (Vers+ΔV) to the pocket P-well of the selected memory block in response to a subsequent resume command (not shown).

In this way, after providing the erase command ERS 310, the memory controller 110 can send a resume command RS to the nonvolatile memory device 120 immediately after an execution of a command being on standby in a command queue is completed. In the case that a command being on standby in a command queue does not exist, the memory controller 110 may provide a resume command RS if the reference time ΔT has elapsed from when the auto suspend (AS) is performed.

In the embodiment of FIG. 5, a resume command RS may be provided depending on whether an execution of a command which the memory controller 110 sent to the nonvolatile memory device 120 is completed or not. In this case, when a standby command does not exist, if the reference time ΔT has elapsed from when the auto suspend (AS) is performed, a resume command RS may be provided.

Figure 6:
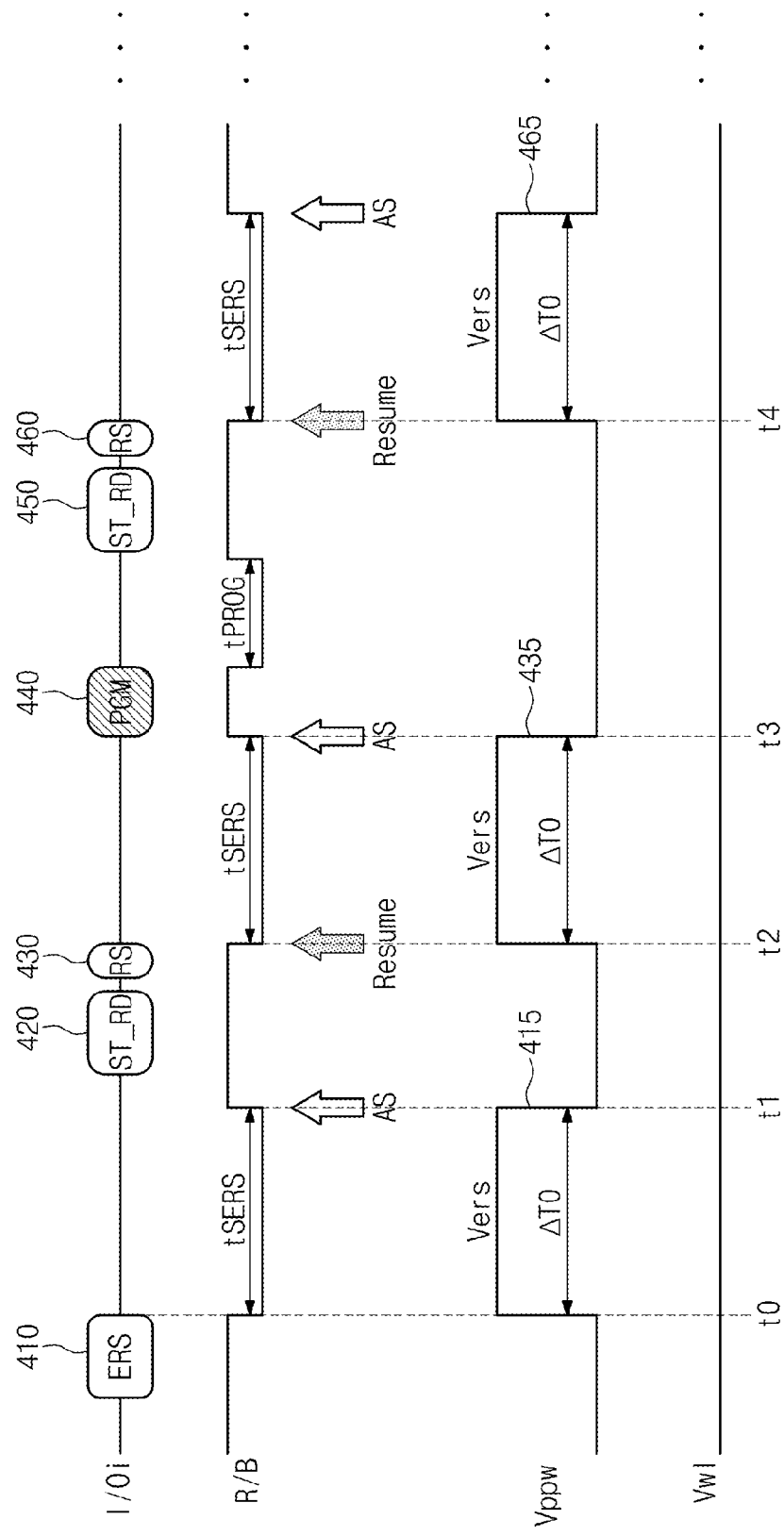
FIG. 6 is a timing diagram illustrating a third embodiment of an erase method of the inventive concept.

FIG. 6 is a timing diagram illustrating a third embodiment of an erase method of the inventive concept. Referring to FIG. 6, the memory controller 110 can send a resume command RS through a status read of the nonvolatile memory device 120.

The memory controller 110, if an erase request occurs, sends an erase command ERS 410 to the input/output stage I/Oi of the nonvolatile memory device 120. The nonvolatile memory device 120 transits the ready/busy signal (R/B) to a busy state at time t0. The nonvolatile memory device 120 outputs the ready/busy signal (R/B) in a busy state and at the same time applies an erase voltage Vers to a pocket P-well of a selected memory block for specific time ΔT0. That is, the nonvolatile memory device 120 applies an erase pulse 415 having a pulse width of the specific time Δ T0 to the pocket P-well of the selected memory block.

At time t1, the nonvolatile memory device 120 executes an auto suspend (AS). An erase voltage Vers being provided to the pocket P-well by the auto suspend (AS) is restored to a level of 0V. The nonvolatile memory device 120 changes the ready/busy signal (R/B) to a ready state. At this time, the memory controller 110 can provide a status read command ST_RD 420 to the nonvolatile memory device 120. If the nonvolatile memory device 120 is in a state that any internal operation is not performed, the memory controller 110 sends a resume command 430 to the nonvolatile memory device 120.

At time t2, the nonvolatile memory device 120 transits the ready/busy signal (R/B) to the busy state and applies an erase voltage Vers to the selected memory block for specific time ΔT0. That is, the nonvolatile memory device 120 applies an erase pulse 435 having a pulse width of the specific time Δ T0 to the pocket P-well of the selected memory block.

At time t3, the memory controller 110 can send a program command PGM 440 to the nonvolatile memory device 120. The nonvolatile memory device 120 writes write data in the selected memory region for program time tPROG in response to the program command PGM 440. After that, the memory controller 110 checks an internal state of the nonvolatile memory device 120 through a status read command ST_RD 450. If a completion of the program operation is checked, the memory controller 110 inputs a resume command 460.

At time t4, the nonvolatile memory device 120 applies an erase pulse 465 corresponding to a pulse width of the specific time ΔT0 to the pocket P-well of the selected memory block in response to the resume command 460. At time when the specific time ΔT0 has elapsed, the nonvolatile memory device 120 performs the auto suspend of the erase operation.

If the defined number of pulses is applied, an erase verify operation may be performed. That is, in response to the resume command RS, the nonvolatile memory device 120 applies an erase verify voltage Vevf to a word line and verifies whether memory cells are erased or not.

The memory controller 110 can determine input time through a status read operation of the nonvolatile memory device 120.

Figure 7:
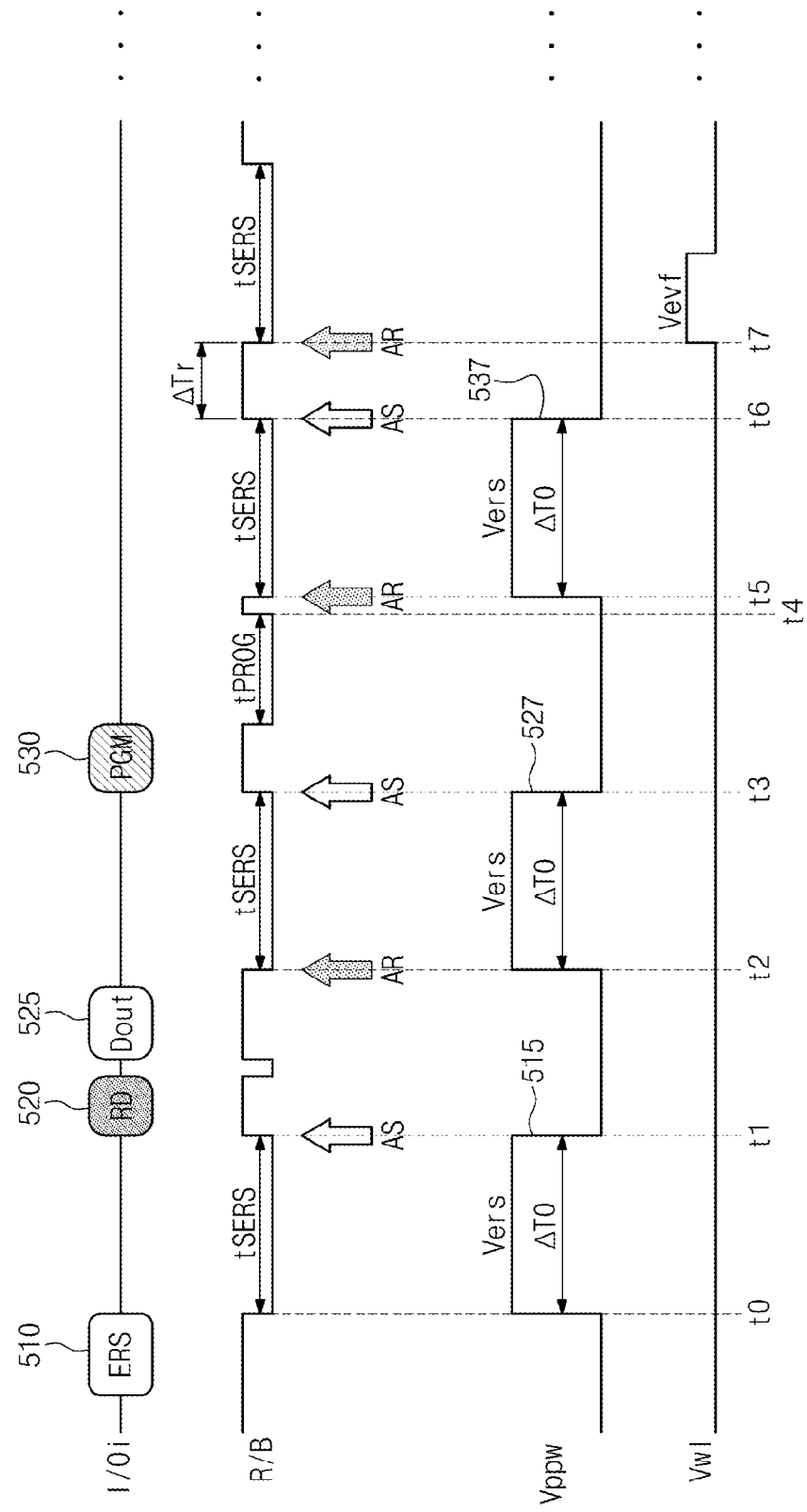
FIG. 7 is a timing diagram illustrating a fourth embodiment of an erase method of the inventive concept.

FIG. 7 is a timing diagram illustrating a fourth embodiment of an erase method of the inventive concept. Referring to FIG. 7, the nonvolatile memory device 120 can perform an auto suspend of an erase pulse and an auto resume of an erase pulse in response to an erase command provided from the memory controller 110.

The memory controller 110, if an erase request occurs, sends an erase command ERS 510 to the nonvolatile memory device 120 through the input/output stage I/Oi of the nonvolatile memory device 120. The nonvolatile memory device 120 transits the ready/busy signal (R/B) to a busy state at time t0. The nonvolatile memory device 120 outputs the ready/busy signal (R/B) in a busy state and at the same time applies an erase voltage Vers to a pocket P-well of a selected memory block for specific time ΔT0. That is, the nonvolatile memory device 120 applies an erase pulse 515 having a pulse width of the specific time Δ T0 to the pocket P-well of the selected memory block.

At time t1, the nonvolatile memory device 120 executes an auto suspend (AS). An erase voltage Vers being provided to the pocket P-well by the auto suspend (AS) is restored to a level of 0V. The nonvolatile memory device 120 changes the ready/busy signal (R/B) to a ready state. The memory controller 110 can provide a read command RD 520 to the nonvolatile memory device 120. In response to the read command 520, the nonvolatile memory device 120 senses a selected memory region to output read data 525. The ready/busy signal (R/B) maintains a ready state in an output section of the read data 525.

If an output of the read data is completed, the nonvolatile memory device 120 can perform an auto resume without a resume command from the memory controller 110. That is, an output of the read data 522 is completed at time t2 and the nonvolatile memory device 120 can apply a unit erase pulse 527 to a memory block selected by the erase command 510 to automatically resume an erase operation.

After the unit erase pulse 527 is applied to the selected memory block, at time t3, the nonvolatile memory device 120 performs an auto suspend (AS) of the erase operation. Then the ready/busy signal (R/B) transits to a ready state. At this time, the memory controller 110 applies a program command 530 to the nonvolatile memory device 120 with reference to the ready/busy signal (R/B). The nonvolatile memory device 120 detects time t4 when a program operation is completed to perform an auto resume at time t5. The completion time of the program operation may coincide with the start time of the auto resume.

According to the auto resume operation at the time t5, the nonvolatile memory device 120 transits the ready/busy signal (R/B) to a busy state and applies a unit erase pulse 537 to the selected memory block. That is, the nonvolatile memory device 120 applies an erase voltage Vers to the pocket P-well of the memory block for the specific time Δ T0.

At time t6, the nonvolatile memory device 120 can perform the auto suspend (AS) and set the ready/busy signal (R/B) to a ready state (i.e, logic high). If a command is not input from the memory controller 110 within the reference time ΔTr from the start time of the auto suspend (AS), the nonvolatile memory device 120 may perform an auto resume.

At time t7, the nonvolatile memory device 120 may perform auto resume (AR) and can perform an erase verify operation in accordance with an erase verify voltage Vevf. The nonvolatile memory device 120 judges whether perform or not the erase operation referring to the erase verify result.

The embodiment was described that the auto suspend (AS) and the auto resume (AR) are performed by the nonvolatile memory device 120 in response to the erase command ERS 510 of the memory controller 110. By automatically performing suspend and resume of the erase operation without an external command, an erase speed is increased and burden of the memory controller 110 on the erase operation can be reduced.

Figure 8:
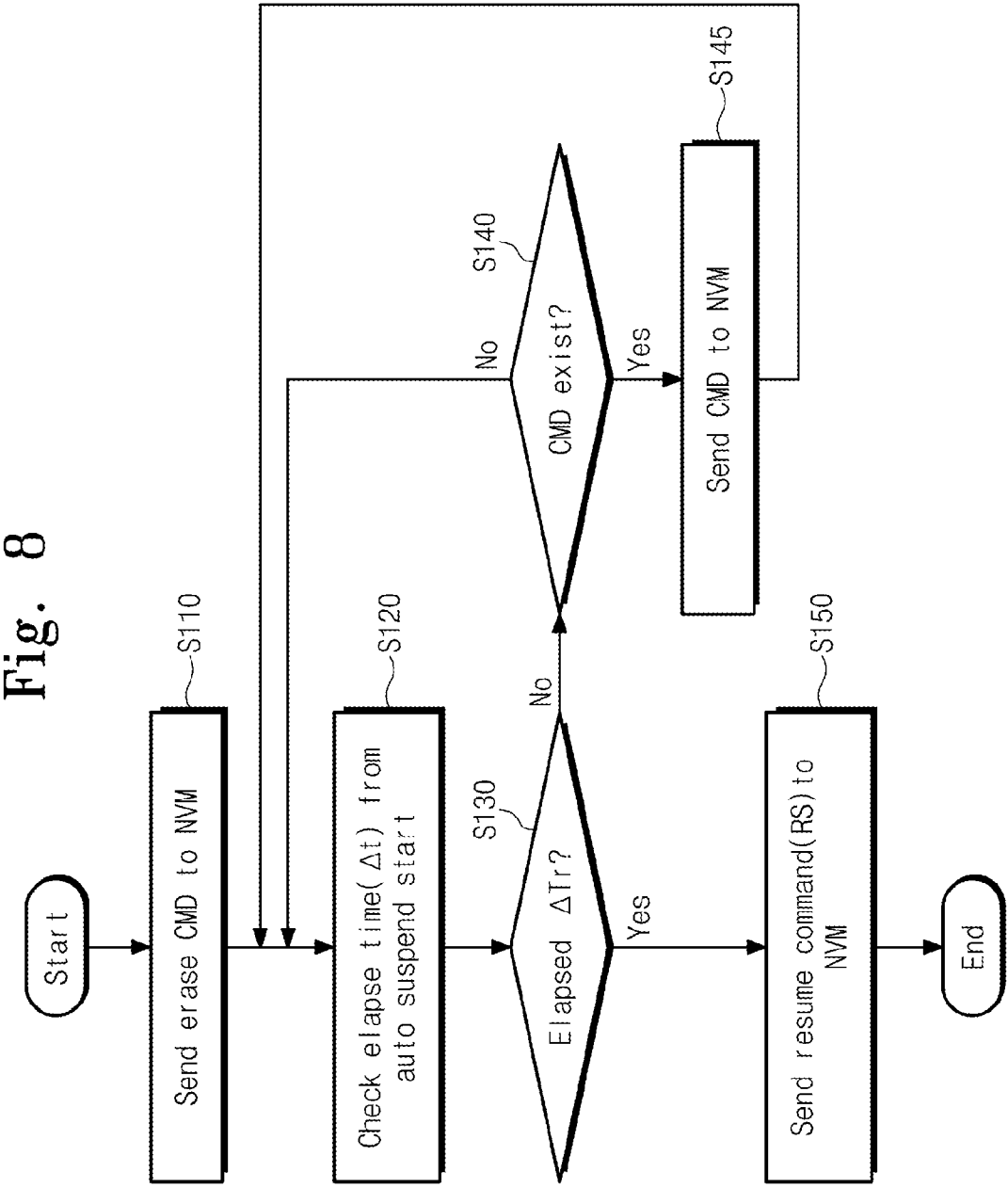
FIG. 8 is a flow chart illustrating an embodiment of an erase method of a memory system in accordance with the inventive concept.

FIG. 8 is a flow chart illustrating an embodiment of an erase method of a memory system in accordance with the inventive concept.

Referring to FIG. 8, a method of providing a command in an erase operation of the memory controller 110 of the memory system 100 is disclosed. The nonvolatile memory device 120, if an erase command is input, automatically suspends an erase operation after the defined specific time.

In a step S110, the memory controller 110 sends an erase command to the nonvolatile memory device 120. An erase request occurs according to a request from a host or various internal memory management operations. The memory controller 110 selects a memory block of the nonvolatile memory device 120 to generate an erase command according to that erase request.

In response to the erase command, the nonvolatile memory device 120 applies a unit erase pulse of the defined pulse width $\Delta T0$ or $\Delta T1$ to the selected memory block. Subsequently, the nonvolatile memory device 120 executes an auto suspend (AS) to temporarily suspend the erase operation.

In a step S120, the memory controller 110 checks time elapsed from start time of the auto suspend (AS) being executed by the nonvolatile memory device 120. The memory controller 110 can count time elapsed from when an erase command or a resume command is applied.

In a step S130, it is detected whether the counted elapsed time $\Delta t$ exceeds a reference time $\Delta Tr$ or not. The reference time $\Delta Tr$ is a section in which the auto suspend (AS) is maintained. The memory controller 110 sends various commands except the erase command to the nonvolatile memory device 120 within the reference time $\Delta Tr$ and the nonvolatile memory device 120 can complete the corresponding operation. Thus, the reference time $\Delta Tr$ may be determined considering time out in which various access commands such as read, write, copy back, etc. can be executed.

In the case that the counted elapsed time $\Delta t$ does not exceed the reference time $\Delta Tr$, the procedure goes to a step S140. In the case that the counted elapsed time $\Delta t$ exceeds the reference time $\Delta Tr$, the procedure goes to a step S150.

In the step S140, the memory controller 110 checks whether or not additional commands to be sent to the nonvolatile memory device 120 exist before the reference time $\Delta Tr$ elapses. If additional commands do not exist, the procedure goes back to the step S120. If additional commands exist, the procedure goes to a step S145. In the step S145, the memory controller 110 sends the additional commands to the nonvolatile memory device 120. However, since a process of the additional commands is completed within the time out, the procedure goes back to the step S120 and the memory controller 110 continues to check the elapsed time $\Delta t$ from when the auto suspend (AS) starts.

In the step S150, since time $\Delta t$ has elapsed from when the auto suspend (AS) starts, the memory controller 110 sends a resume command (RS) to the nonvolatile memory device 120. An erase operation of the nonvolatile memory device 120 continues by the resume command (RS), and repetition of the resume command (RS) and the auto suspend command (AS) continues until the erase operation is finished.

A control operation of the memory controller 110 was described which sends the resume command with reference to the elapsed time $\Delta t$ from when the auto suspend (AS) starts. In that embodiment, the memory controller 110 has to send access commands except the erase command to the nonvolatile memory device 120 within the elapsed time $\Delta t$ from when the auto suspend (AS) starts. The nonvolatile memory device 120 completes an operation corresponding to the access command sent from the memory controller 110 within the elapsed time $\Delta t$ from when the auto suspend (AS) starts. The elapsed time scale may be determined considering all those conditions.

Figure 9:
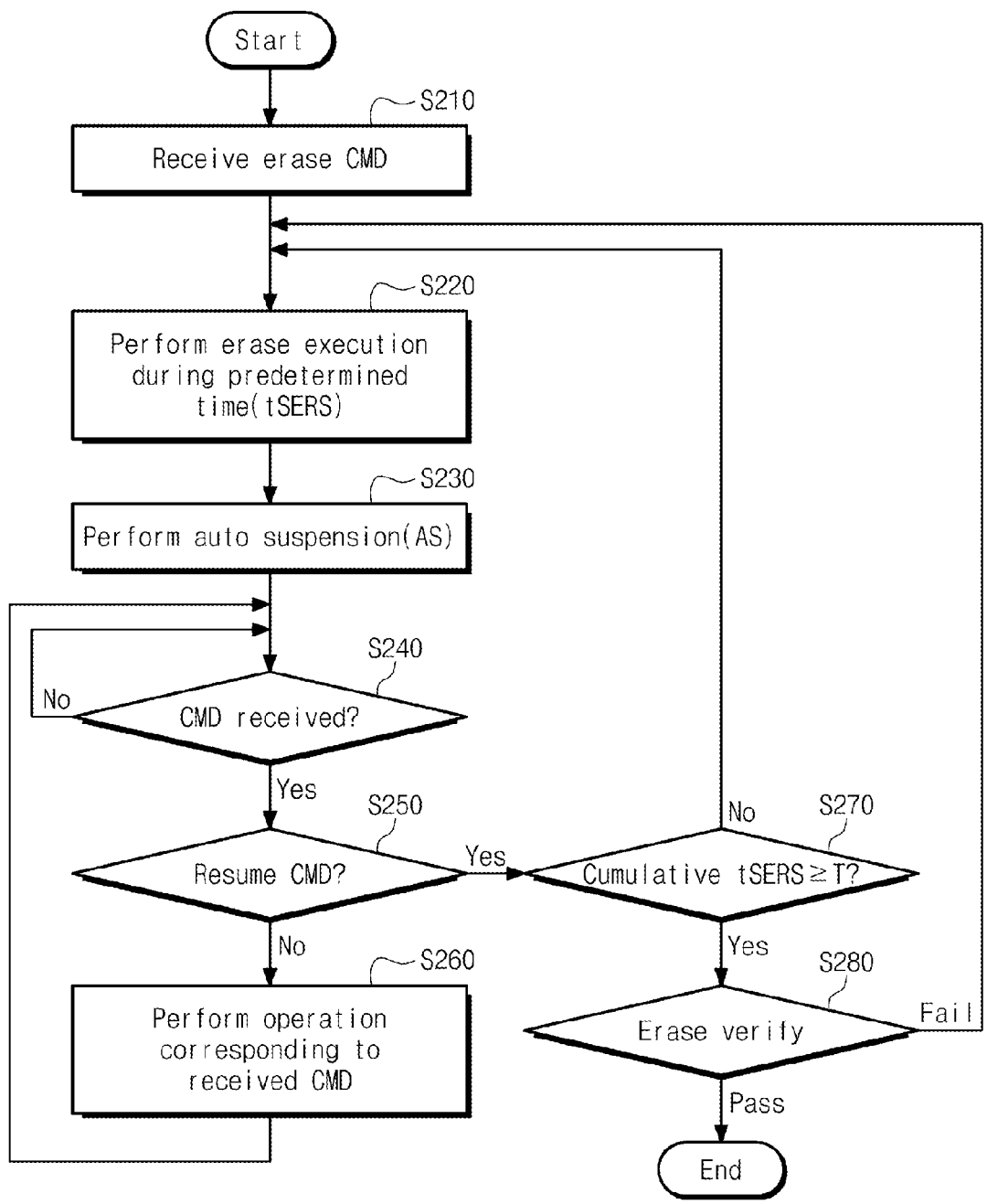
FIG. 9 is a flow chart illustrating an erase method of a nonvolatile memory device 120 connected to a memory controller 110 illustrated in FIG. 1.

FIG. 9 is a flow chart illustrating an erase method of a nonvolatile memory device 120 connected to a memory controller 110 performing the erase method of FIG. 8. Referring to FIG. 9, in response to the erase command or the resume command from the memory controller 110, the nonvolatile memory device 120 executes the auto suspend (AS) after the segment erase time tSERS or the unit pulse width $\Delta T0$ or $\Delta T1$. The nonvolatile memory device 120 can execute various further commands being from the memory controller 110 within the auto suspend (AS) section.

In a step S210, the nonvolatile memory device 120 receives an erase command being sent from the memory controller 110. The erase command includes information about a memory region to be erased.

In a step S220, the nonvolatile memory device 120 performs an erase operation on a memory region (for example, a memory block) selected for the segment erase time tSERS. That is, the nonvolatile memory device 120 provides the unit erase pulse 215 (refer to FIG. 4) of the pulse width $\Delta T0$ to the selected memory region.

In a step S230, the nonvolatile memory device 120 performs the auto suspend (AS). That is, the nonvolatile memory device 120 removes the unit erase pulse 215 from the selected memory block and stops a supply of all erase biases.

In a step S240, the nonvolatile memory device 120 monitors whether or not additional command is being provided from the memory controller 110. If the additional command does not exist, the nonvolatile memory device 120 is on standby in an auto suspend (AS) state. If the additional command exists, the procedure goes to a step S250.

In the step S250, the nonvolatile memory device 120 checks whether the additional command corresponds to resume command (RS) or not. If the additional command is not resume command (RS), the procedure goes to a step S260 to perform an operation corresponding to the additional command. If the additional command is resume command (RS), the procedure goes to the step S270.

In the step S260, the nonvolatile memory device 120 performs an operation of the received additional commands. Then the procedure goes back to the step S240 and it can be monitored whether a new command or a new resume command is sent.

In the seep S270, the nonvolatile memory device 120 determines whether a cumulative segment erase time tSERS is over a reference time T or not. The cumulative segment erase time tSERS corresponds to a total time of which the unit erase pulses 215, 225 and 235 (refer to FIG. 4) are applied to the memory block. If the cumulative segment erase time tSERS is same or exceeds the reference time T, the procedure goes to a step S280 to perform an erase verify operation. While the cumulative segment erase time tSERS is not more than the reference time T, the procedure goes to a step S220 to continue the erase operation on the memory block by the erase voltage Vers.

In the seep S280, an erase verify operation is performed. If the threshold voltages of memory cells being erased are lower than the erase verify voltage Vevf (Pass direction), an erase process is over. However, if memory cells having threshold voltages higher than the erase verify voltage Vevf exist among memory cells being erased (Fail direction), the procedure goes to a step S220 to continue the erase operation on the memory block by an increased erase voltage (Vers+$\Delta V$). An operation method of the nonvolatile memory device 120 was described which performs the auto suspend (AS) at time set in advance in response to the erase command or the resume command. The methods illustrated in FIGS. 8 and 9 are embodiments more specifically showing the operation method of the memory system 100 described in FIG. 4.

Figure 10:
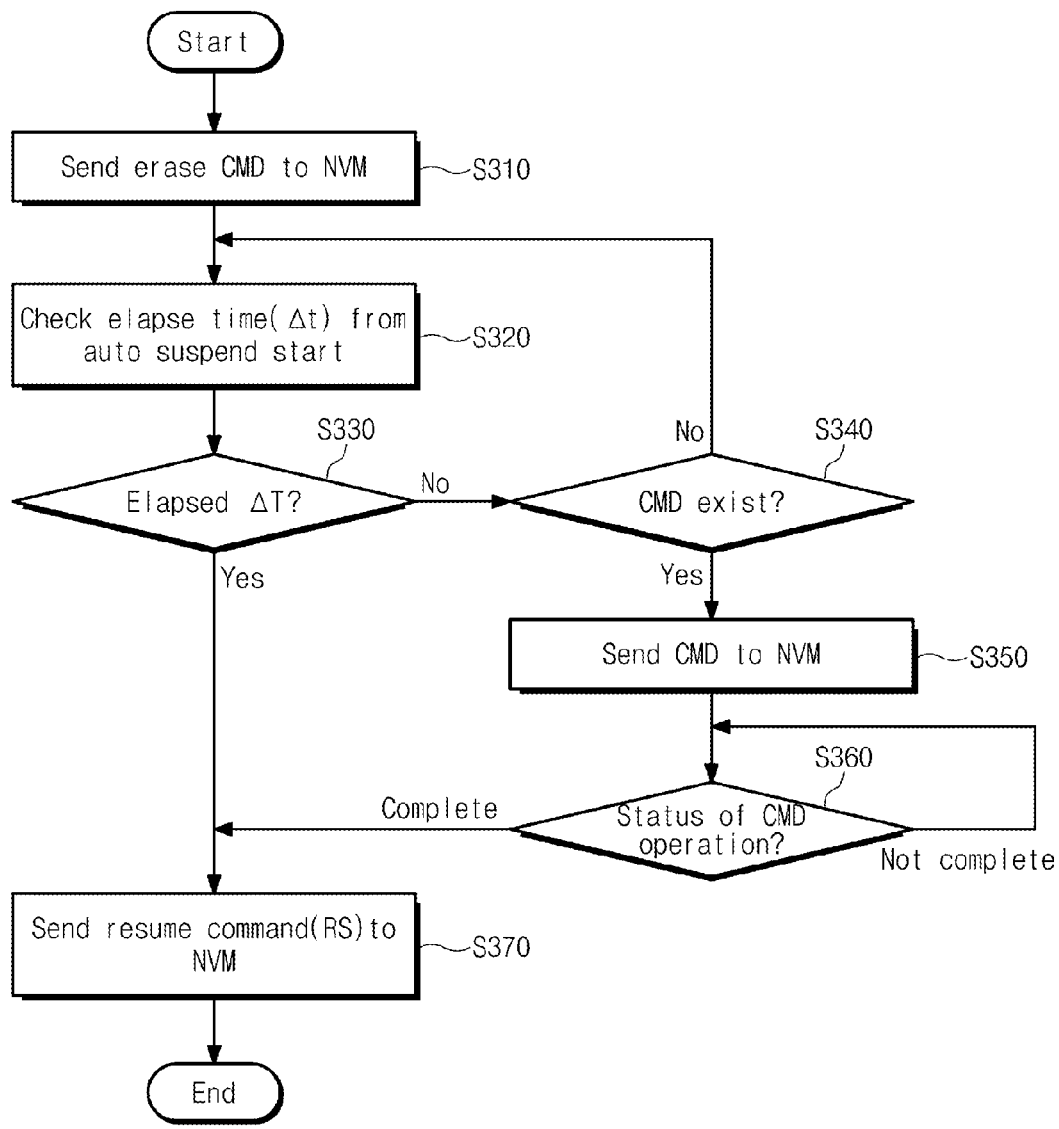
FIGS. 10 and 11 are flow charts for reference in explaining other embodiments of the inventive concept.
Figure 11:
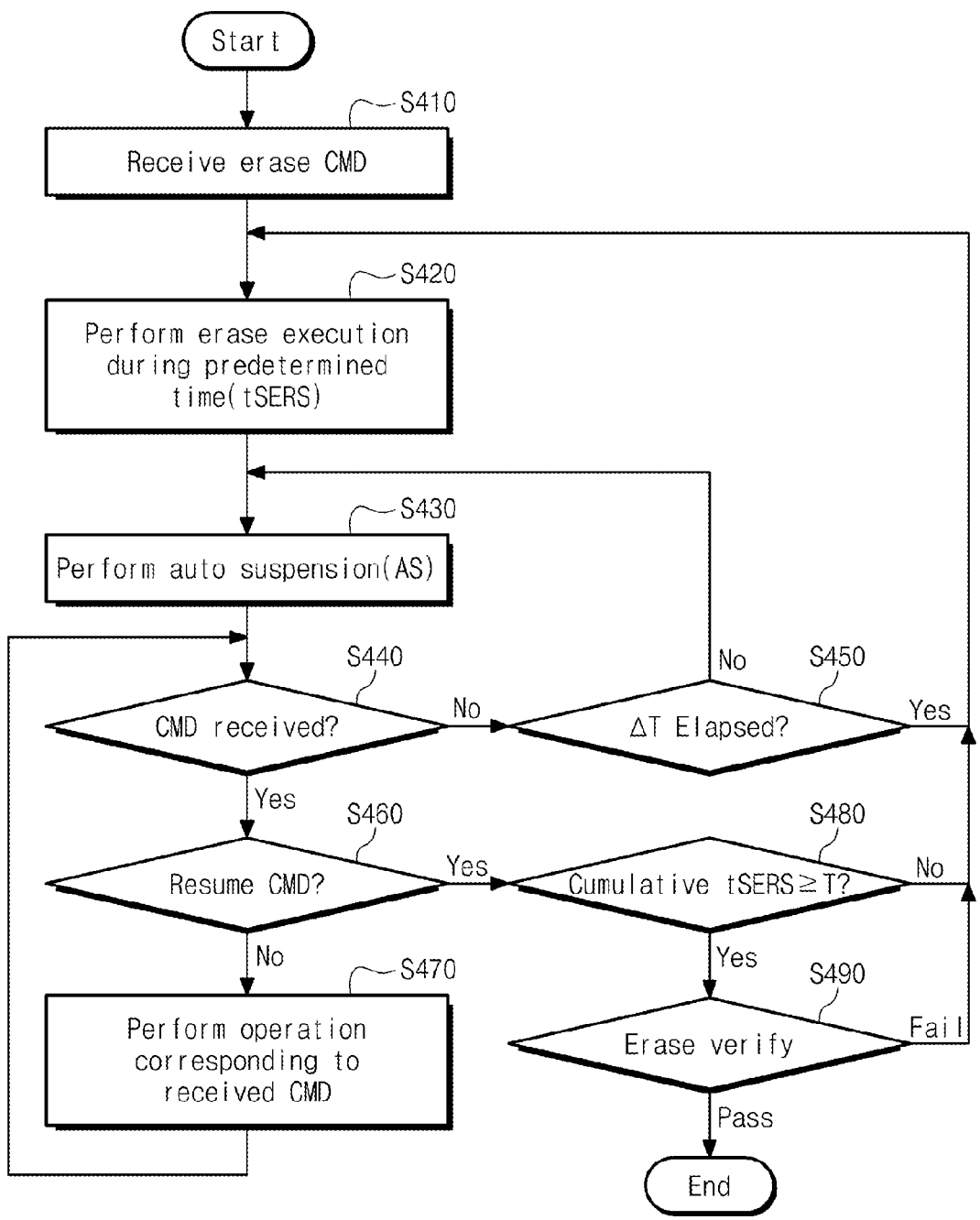

FIGS. 10 and 11 are flow charts explaining other embodiments of the inventive concept. Referring to FIGS. 10 and 11, a procedure is described that the memory controller 110 provides the resume command (RS) after checking a state of the nonvolatile memory device 120. FIG. 10 illustrates an operation of the memory controller 110 and FIG. 11 illustrates an operation of the nonvolatile memory device 120.

Referring to FIG. 10, a method is disclosed that the memory controller 110 of the memory system 100 provides a command in an erase operation. If an erase command is input to the nonvolatile memory device 120, the nonvolatile memory device 120 performs an auto suspend (AS) after the defined specific time has elapsed.

In a step S310, the memory controller 110 sends an erase command to the nonvolatile memory device 120. An erase request occurs according to a request from a host or a management operation of various internal memories. The memory controller 110 selects a memory block of the nonvolatile memory device 120 to perform an erase operation according to the erase request.

In response to the erase command, the nonvolatile memory device 120 applies a unit erase pulse of the defined pulse width Δ T0 or Δ T1 to the selected memory block. Subsequently, the nonvolatile memory device 120 executes an auto suspend (AS) to temporarily suspend the erase operation.

In a step S320, the memory controller 110 counts time Δ t elapsed from start time of the auto suspend (AS) being executed by the nonvolatile memory device 120. The memory controller 110 includes information about start time of the auto suspend (AS) after the erase command is provided. The memory controller 110 can count time Δ t elapsed from when an erase command or a resume command is applied.

In a step S330, it is checked whether the counted elapsed time Δ t exceeds a reference time Δ T or not. The reference time Δ T is a section in which the auto suspend (AS) is maintained without an additional command. Thus, if an additional command does not exist even after the reference time Δ T, a resume operation may be performed. In the case that the elapsed time Δ t does not exceed the reference time Δ T, the procedure goes to a step S340. In the case that the elapsed time Δ t exceeds the reference time Δ T, the procedure goes to a step S370.

In the step S340, the memory controller 110 checks whether an additional command to be sent to the nonvolatile memory device 120 exists or not before the reference time Δ T elapses. If the additional command does not exist, the procedure goes back to the step S320. If the additional command exists, the procedure goes to a step S350.

In the step S350, the memory controller 110 sends the additional command to the nonvolatile memory device 120.

In a step S360, the memory controller 110 checks a state of the nonvolatile memory device 120 with respect to the additional command. For example, it is possible to check a state of the nonvolatile memory device 120 with reference to a change of a state read command or a ready/busy signal (R/B) with respect to the nonvolatile memory device 120. In the case that a state of the nonvolatile memory device 120 does not complete an execution of the additional command, the procedure repeats the step S360 of checking a state of the nonvolatile memory device 120 until the execution of the additional command is finished. In the case that the nonvolatile memory device 120 completes an execution of the additional command, the procedure goes to the step S370.

In the step S370, the memory controller 110 sends a resume command to the nonvolatile memory device 120.

A control operation of the memory controller 110 was described which sends a resume command with reference to the time Δ t elapsed from start time of the auto suspend (AS) and a completion state with response to the additional command. In this embodiment, the memory controller 110 is somewhat free with respect to time intervals of performing access commands except the erase command. If a specific time additional command is not provided after the auto suspend, a resume operation is automatically performed and thereby an erase resume operation may be performed earlier. Even though performance time of the additional command becomes long, since a resume operation is performed according to an performance state of the additional command, it is not necessary to strictly limit time resources.

FIG. 11 is a flow chart illustrating an erase method of the nonvolatile memory device 120 connected to the memory controller 110 performing the erase method of FIG. 10. Referring to FIG. 11, in response to an erase command or a resume command from the memory controller 110, the nonvolatile memory device 120 performs an auto suspend (AS) after a segment time tSERS. The memory controller 110 can provide the resume command depending on whether additional commands being provided between erase pulses are completed or not.

In a step S410, the nonvolatile memory device 120 receives the erase command being sent from the memory controller 110. The erase command includes information about a memory region to be erased.

In a step S420, the nonvolatile memory device 120 performs an erase operation at a selected memory block for the segment erase time tSERS. That is, the nonvolatile memory device 120 provides the unit erase pulse 315 (refer to FIG. 5) of the pulse width Δ T0 to the selected memory block.

In a step S430, the nonvolatile memory device 120 performs the auto suspend (AS). That is, the nonvolatile memory device 120 removes the unit erase pulse 315 from the selected memory block and stops a supply of all erase biases.

In a step S440, the nonvolatile memory device 120 monitors whether or not additional commands are being provided from the memory controller 110. If the additional commands do not exist, the procedure goes to a step S450. If the additional commands exist, the procedure goes to a step S460.

In the step S450, the nonvolatile memory device 120 detects whether time Δ t elapsed from the auto suspend (AS) exceeds a reference time Δ T. In the case that the elapsed time Δ t is less than the reference time Δ T, the procedure goes back to the step S430. In the case that the elapsed time Δ t is equal to or more than the reference time Δ T, the procedure goes to the step S420 to perform the resume operation.

In the step S460, the nonvolatile memory device 120 checks whether the additional command corresponds to resume command (RS) or not. If the additional command is not resume command (RS), the procedure goes to a step S470 to perform an operation corresponding to the additional command. If the additional command corresponds to resume command (RS), the procedure goes to the step S480.

In the step S470, the nonvolatile memory device 120 performs an operation corresponding to a received additional command. If performance of the additional command is completed, the procedure goes back to the step S440 to detect whether a new additional command exists or whether the elapsed time Δ t exceeds the reference time Δ T.

In the seep S480, the nonvolatile memory device 120 determines whether a cumulative segment erase time tSERS is over a reference time T or not. The cumulative segment erase time tSERS corresponds to a total time of which the unit erase pulses 215, 225 and 235 (refer to FIG. 4) are applied to the memory block. If the cumulative segment erase time tSERS is same or exceeds the reference time T, the procedure goes to a step S490 to perform an erase verify operation. While the cumulative segment erase time tSERS is not more than the reference time T, the procedure goes to a step S420 to continue the erase operation on the memory block by the erase voltage Vers.

In the seep S490, an erase verify operation is performed. If the threshold voltages of memory cells being erased are lower than the erase verify voltage Vevf (Pass direction), an erase process is over. However, if memory cells having threshold voltages higher than the erase verify voltage Vevf exist among memory cells being erased (Fail direction), the procedure goes to a step S420 to continue the erase operation on the memory block by an increased erase voltage (Vers+Δ V).

An operation method of the nonvolatile memory device 120 was described which performs the auto suspend (AS) at time set in advance in response to the erase command or the resume command. The methods illustrated in FIGS. 10 and 11 are embodiments more specifically showing the operation method of the memory system 100 described in FIGS. 5 and 6.

Figure 12:
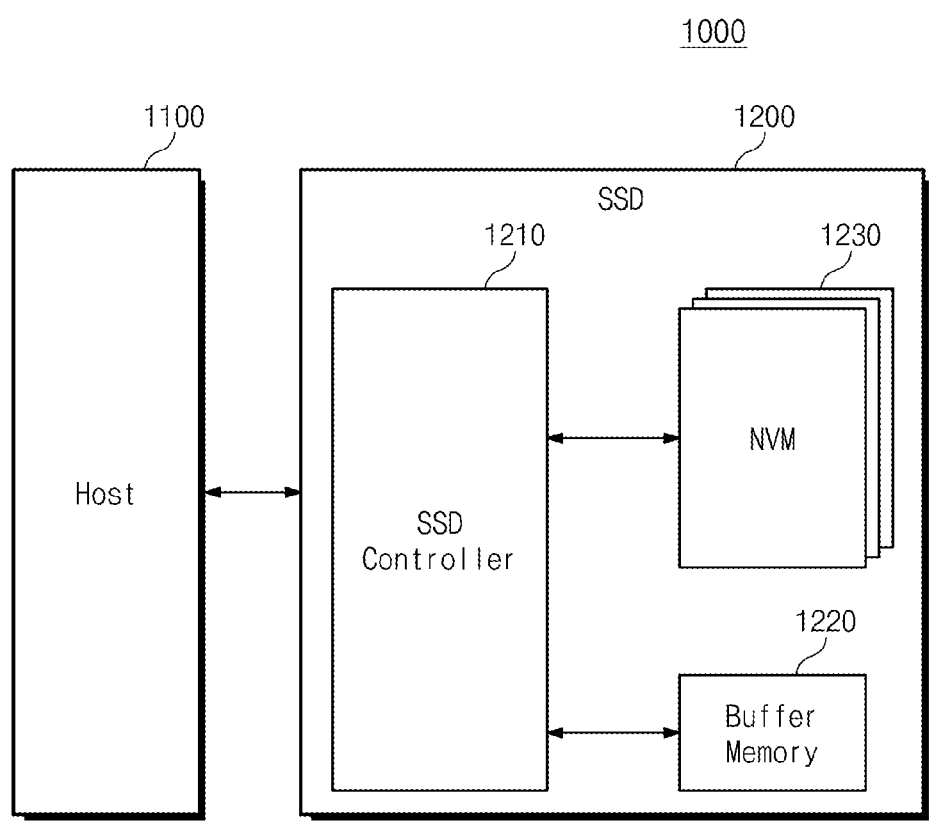
FIG. 12 is a block diagram illustrating a user device including a solid state drive in accordance with an embodiment of the inventive concept.

FIG. 12 is a block diagram illustrating a user device including a solid state drive in accordance with an embodiment of the inventive concept. Referring to FIG. 12, a user device 1000 includes a host 1100 and a SSD 1200. The SSD 1200 includes a SSD controller 1210, a buffer memory 1220 and a nonvolatile memory device 1230.

The SSD controller 1210 provides a physical connection between the host 1100 and the SSD 1200. That is, the SSD controller 1210 provides an interface with the SSD 1200 in response to a bus format of the host 1100. The SSD controller 1210 provides an erase command and a resume command to the nonvolatile memory device 1230. Examples of the bus format of the host 1100 include a universal serial bus (USB), a small computer system interface (SCSI), a PCI express, an ATA, a parallel ATA, a serial ATA, a serial attached SCSI, etc.

The buffer memory 1220 temporarily stores write data being provided from the host 1100 or data read from the nonvolatile memory device 1230. In the case that data that exists in the nonvolatile memory device 1230 is cached when a read request occurs from the host 1100, the buffer memory 1220 supports a cache function of directly providing cached data to the host 1100. A data transmission speed by the bus format (for example, SATA or SAS) is much higher than a transmission speed of a memory channel of the SSD 1200. That is, in the case that an interface speed of the host 1100 is very high, performance degradation being caused by the speed difference can be minimized by providing the large-capacity buffer memory 1220.

The nonvolatile memory device 1230 is provided as a storage medium. For example, the nonvolatile memory device 1230 may be provided by a NAND type flash memory having large capacity storage ability in which cells are three dimensionally stacked. The nonvolatile memory device 1230 can be constituted by a plurality of memory devices. In this case, each memory device is connected to the SSD controller 1210 by a channel unit. The nonvolatile memory device 1230 separates an erase pulse of a specific pulse width to apply the separated erase pulse to a selected memory block in response to an erase command. That is, if a reference time elapsed from when an erase voltage is applied, the nonvolatile memory device 1230 automatically stops an erase operation. An erase operation with respect to a corresponding block is resumed in response to a resume command being provided from the SSD controller 1210. The SSD controller 1210 can send a resume command with reference to an operation state of the nonvolatile memory device 1230 or time elapsed from an auto suspend.

A NAND type flash memory is provided as a storage medium in the examples above, but different types of nonvolatile memory devices may be used as a storage medium. For example, a PRAM, a MRAM, an ReRAM, a FRAM, a NOR flash memory, etc. may be used as a storage medium. A memory system in which different types of memory device are mixed may also be used as a storage medium. The nonvolatile memory device 1230 may include a buffer region for a buffer program operation and a main region for a main program operation.

Figure 13:
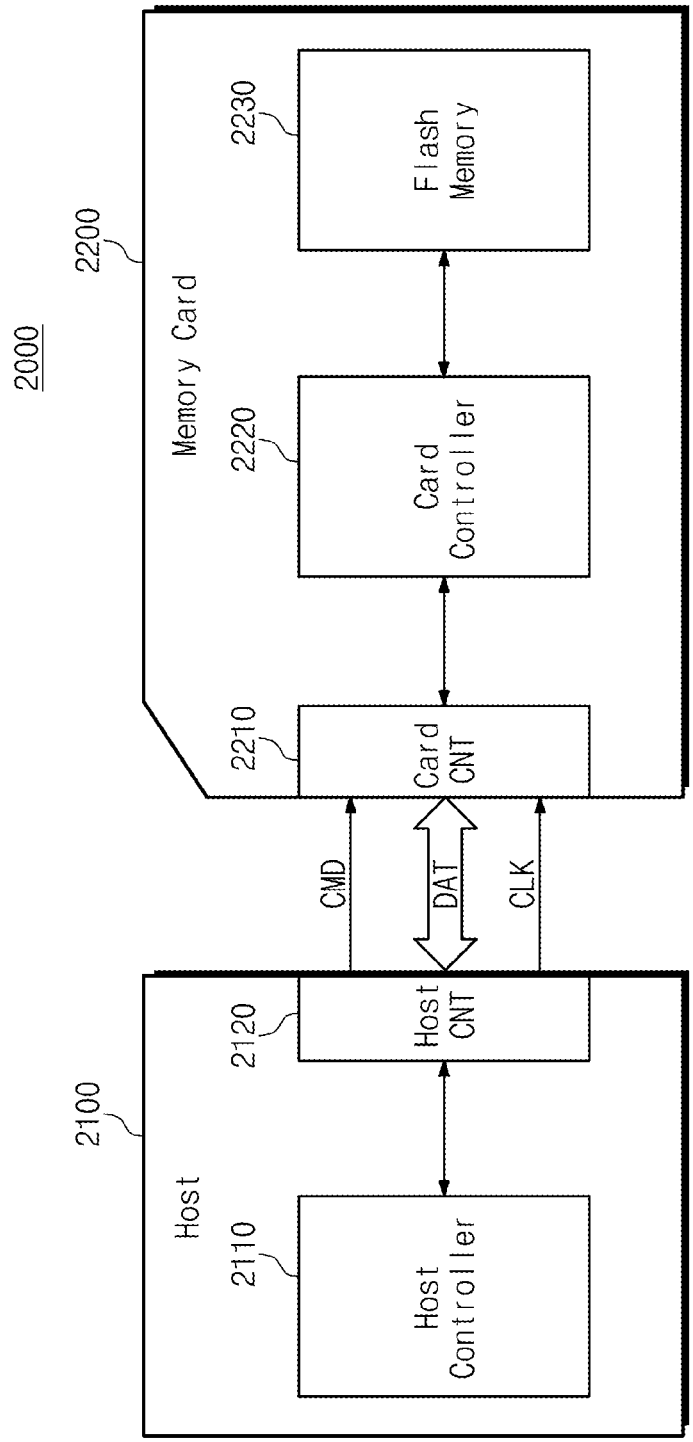
FIG. 13 is a block diagram illustrating a card system in accordance with an embodiment of the inventive concept.

FIG. 13 is a block diagram illustrating a card system in accordance with an embodiment of the inventive concept. Referring to FIG. 13, a memory card system 2000 includes a host 2100 and a memory card 2200. The host 2100 includes a host controller 2110 and a host connection unit 2120. The memory card 2200 includes a card connection unit 2210, a card controller 2220 and a flash memory 2230.

The host connection unit 2120 is constituted by a plurality of pins. Examples of the pins include a command pin, a data pin, a clock pin, a power supply pin, etc. The number of pins becomes different depending on the type of the memory card 2200.

The host 2100 writes data in the memory card 2200 or reads data stored in the memory card 2200. The host controller 2110 transmits a command (e.g., a write command), a clock signal CLK generated from a clock generator in the host 2100 and data DATA to the memory card 2200 through the host connection unit 2120.

The card controller 2220 stores data in the flash memory 2230 in synchronization with a clock signal CLK generated from a clock generator in the card controller 2220 in response to a write command received through the card connection unit 2210. The flash memory 2230 stores data transmitted from the host 2100. In the case that the host 2100 is a digital camera, the flash memory 2230 stores image data. The memory card 2200 may be constituted by an embedded multimedia card eMMC.

The flash memory 2230 separates an erase pulse of a specific pulse width to apply the separated erase pulse to a selected memory block in response to an erase command. That is, if a reference time elapsed from when an erase voltage is applied, the flash memory 2230 automatically stops an erase operation. An erase operation with respect to a corresponding block is resumed in response to a resume command being provided from the card controller 2220. The card controller 2220 can send a resume command with reference to an operation state of the flash memory 2230 or time elapsed from an auto suspend.

The card connection unit 2210 is configured to communicate with the outside (for example, a host) through one of various interface protocols such as a USB, a MMC, a PCI-E, a SAS, a SATA, a PATA, a SCSI, an ESDI and an IDE.

Figure 14:
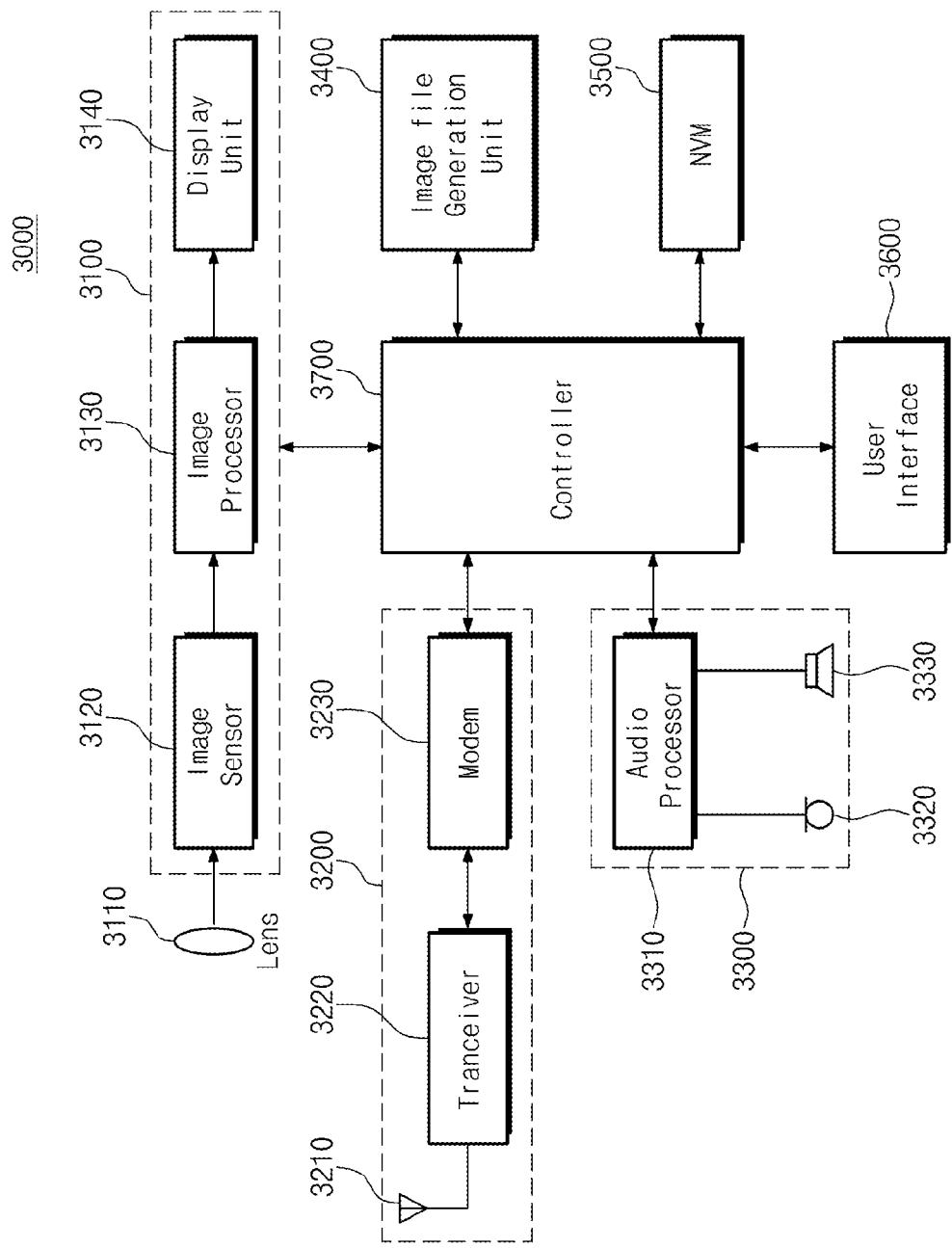
FIG. 14 is a block diagram illustrating a portable terminal in accordance with an embodiment of the inventive concept.

FIG. 14 is a block diagram illustrating a portable terminal in accordance with an embodiment of the inventive concept. Referring to FIG. 14, the portable terminal 3000 includes an image processing unit 3100, a wireless transmission/reception unit 3200, an audio processing unit 3300, an image file generating unit 3400, a nonvolatile memory device 3500, a user interface 3600 and a controller 3700.

The image processing unit 3100 includes a lens 3110, an image sensor 3120, an image processor 3130, and a display unit 3140. The wireless transmission/reception unit 3200 includes an antenna 3210, a transceiver 3220 and a modem 3230. The audio processing unit 3300 includes an audio processor 3310, a mike 3320 and a speaker 3330.

The nonvolatile memory device 3500 may be provided by at least one of a memory system, a memory card, a SSD and an eMMC that are driven according to embodiments of the inventive concept. In this case, the nonvolatile memory device 3500 separates an erase pulse of a specific pulse width to apply the separated erase pulse to a selected memory block in response to an erase command. That is, if a reference time elapsed from when an erase voltage is applied, the nonvolatile memory device 3500 automatically stops an erase operation. The nonvolatile memory device 3500 resumes an erase operation with respect to a corresponding block with reference to a resume command.

The nonvolatile memory device and/or the memory controller can be packaged using any of various types of packaging technologies such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

In the nonvolatile memory device of the inventive concept, all the memory cells and all the memory blocks may be erased by the same erase bias. Thus, the memory system of the inventive concept may provide high erase reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. An erase method of a three-dimensional nonvolatile memory device, comprising:
    receiving an erase command;
    applying an erase voltage to perform an erase operation to a selected memory region in response to the erase command;
    suspending the erase operation by cutting off the erase voltage after a specific time has elapsed from when the erase voltage is applied;
    receiving a resume command after a reference time has elapsed from the time the erase operation is suspended; and
    applying the erase voltage to the memory region for the specific time according to the resume command.

2. The erase method of claim 1, wherein the erase command and the resume command are provided from a memory controller controlling the nonvolatile memory device.

3. The erase method of claim 1, further comprising the nonvolatile memory device receiving an access command for the reference time.

4. The erase method of claim 3, wherein the reference time is provided to have a time length that can complete an execution of the access command.

5. The erase method of claim 3, wherein the resume command is input at a time when an operation corresponding to the access command is completed.

6. The erase method of claim 5, further comprising detecting a state of the nonvolatile memory device to judge whether an execution of the access command is completed.

7. The erase method of claim 1, further comprising counting an elapsed time from when the erase operation is stopped in the memory controller controlling the nonvolatile memory device.

8. The erase method of claim 1, further comprising:
    stopping the erase operation by the erase voltage after the specific time has elapsed from when the erase voltage is applied;
    receiving another resume command after the reference time has elapsed from when the erase operation is stopped; and
    applying an erase verify voltage for detecting whether an erase of the memory region is completed in response to the other resume command.

9. A memory system comprising:
    a nonvolatile memory device configured to apply an erase voltage for a specific time to a selected memory region in response to an erase command and to remove the erase voltage without an external control after the specific time has elapsed; and
    a memory controller configured to provide the nonvolatile memory device with at least one resume command for providing the erase voltage for the specific time with reference to a state of the nonvolatile memory device after providing the erase command to the nonvolatile memory device.

10. The memory system of claim 9, wherein when a reference time has elapsed from when the erase voltage is removed, the memory controller provides the resume command.

11. The memory system of claim 10, wherein the memory controller counts the reference time at a time when the erase voltage of the nonvolatile memory device is removed with reference to a corresponding ready/busy signal.

12. The memory system of claim 10, wherein the memory controller provides an access command to the nonvolatile memory device for the reference time.

13. The memory system of claim 12, wherein the memory controller provides the resume command with reference to whether the nonvolatile memory device completes an execution of the access command.

14. The memory system of claim 9, wherein the nonvolatile memory device comprises three-dimensional NAND type flash memory cells of which a cell string is formed in a direction perpendicular to a substrate.

15. A nonvolatile memory device including a plurality of three-dimensional NAND type flash memory cells, comprising:
    a cell array including at least one memory block;
    a row decoder configured to provide an erase voltage to a selected memory block;
    a page buffer unit including a plurality of page buffers and configured to perform an erase verification operation in order to sense whether erasure of the selected memory block is completed; and
    a control logic configured to control the row decoder and the page buffer to apply an erase voltage for a specific time to the selected memory block in response to an erase command and suspend applying the erase voltage automatically after the specific time has elapsed.

16. The nonvolatile memory device of claim 15, wherein the control logic resumes applying the erase voltage in response to a resume command provided from an external device.

17. The memory system of claim 16, wherein the control logic controls the row decoder and the page buffer to perform an access operation on a specific memory area in response to an access command during a time period from the suspending to the resuming the erase voltage.

18. The memory system of claim 16, wherein the control logic is configured to control the row decoder and the page buffer to apply the erase voltage for a specific time to the selected memory block in response to the resume command and suspend applying the erase voltage automatically after the specific time elapsed.

19. The memory system of claim 15, wherein the control logic is configured to control the row decoder and the page buffer to perform the erase verification operation when a cumulative applying time of the erase voltage is the same as or exceeds a reference time.

20. The memory system of claim 19, wherein the erase voltage applied to the selected memory block increases as a result of the erase verification corresponding to a fail.

* * * * *